United States Patent
Otani et al.

(10) Patent No.: US 10,818,837 B1
(45) Date of Patent: Oct. 27, 2020

(54) SEED LAYERS FOR A NON-VOLATILE MEMORY ELEMENT

(71) Applicant: GLOBALFOUNDRIES Singapore Pte. Ltd., Singapore (SG)

(72) Inventors: Yuichi Otani, Singapore (SG);
Kazutaka Yamane, Singapore (SG);
Ganesh Kolliyil Rajan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/407,661

(22) Filed: May 9, 2019

(51) Int. Cl.
*H01L 43/10* (2006.01)
*H01L 43/12* (2006.01)
*H01L 43/08* (2006.01)
*H01L 27/22* (2006.01)

(52) U.S. Cl.
CPC ............ *H01L 43/10* (2013.01); *H01L 27/228* (2013.01); *H01L 43/08* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 6,703,654 B1 * | 3/2004 | Horng | B82Y 10/00 257/295 |
| 7,298,588 B2 | 11/2007 | Lee et al. | |
| 7,476,954 B2 | 1/2009 | Wang et al. | |
| 7,993,765 B2 | 8/2011 | Kim et al. | |
| 9,490,054 B2 | 11/2016 | Jan et al. | |
| 2008/0090307 A1 * | 4/2008 | Xiao | H01L 43/12 438/3 |
| 2017/0125664 A1 | 5/2017 | Tahmasebi et al. | |
| 2018/0261763 A1 * | 9/2018 | Annunziata | H01L 43/08 |
| 2019/0122799 A1 * | 4/2019 | Shum | H01F 10/3254 |

* cited by examiner

*Primary Examiner* — Benjamin P Sandvik
(74) *Attorney, Agent, or Firm* — Thompson Hine LLP

(57) ABSTRACT

Structures for a non-volatile memory element and methods of fabricating a structure for a non-volatile memory element. The structure includes a bottom electrode, a seed layer on the bottom electrode, and a magnetic-tunneling-junction layer stack on the seed layer. The seed layer is composed of a nickel-chromium-ruthenium alloy including ruthenium in an amount ranging from seven atomic percent by weight to eighty-four atomic percent by weight.

20 Claims, 4 Drawing Sheets

SEED LAYERS FOR A NON-VOLATILE MEMORY ELEMENT

BACKGROUND

The present invention relates to integrated circuits and semiconductor device fabrication and, more specifically, to structures for a non-volatile memory element and methods of forming a structure for a non-volatile memory element.

A magnetoresistive random access memory (MRAM) device provides an embedded non-volatile memory technology in which the memory elements operate based on principles of magnetoresistance. Because its memory elements are non-volatile, the data stored by the MRAM device is retained when unpowered. The MRAM device includes multiple bitcells that may be arranged in the rows and columns of an array. Each individual bitcell in the array includes a magnetoresistive memory element and a field-effect transistor that controls access to the magnetoresistive memory element for reading and writing data. Each field-effect transistor may include a gate with a single gate electrode or a gate that includes a pair of gate electrodes. A word line is connected to the gate or gates of the field-effect transistors in each row of the array. The word line may be used to select the field-effect transistors in a column of bitcells for data read and write operations to the associated magnetoresistive memory elements.

The magnetoresistive memory element of each bitcell includes a pinned layer and a free layer, each of which holds a magnetization with a given orientation. The magnetization of the pinned layer is fixed in its magnetic orientation, and the magnetization of the free layer can be switched by, for example, the application of a programming current. In particular, the magnetic orientations of the pinned and free layers may be programmed to have either a parallel state that provides a low electrical resistance across the layers ("0" state) or an antiparallel state that provides a high electrical resistance across the layers ("1" state).

The layer stack of the magnetoresistive memory element is formed on a seed layer that establishes a growth template for the layer stack. Seed layers may be formed from an alloy containing only nickel and chromium. A difficulty encountered with seed layer formed from such alloys is surface roughness. The surface roughness of the seed layer propagates upward through the layer stack of the magnetoresistive memory element as overlying layers are successively formed, which may reduce thermal stability and perpendicular magnetic anisotropy.

Improved structures for non-volatile memory element and methods of forming a structure for a non-volatile memory element are needed.

SUMMARY

According to an embodiment of the invention, a structure for a non-volatile memory element is provided. The structure includes a bottom electrode, a seed layer on the bottom electrode, and a magnetic-tunneling-junction layer stack on the seed layer. The seed layer is composed of a nickel-chromium-ruthenium alloy including ruthenium in an amount ranging from seven atomic percent by weight to eighty-four atomic percent by weight.

According to another embodiment of the invention, a method of forming a non-volatile memory element is provided. The method includes forming a bottom electrode, depositing a seed layer on the bottom electrode, and forming a magnetic-tunneling-junction layer stack on the seed layer. The seed layer is composed of a nickel-chromium-ruthenium alloy including ruthenium in an amount ranging from seven atomic percent by weight to eighty-four atomic percent by weight.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
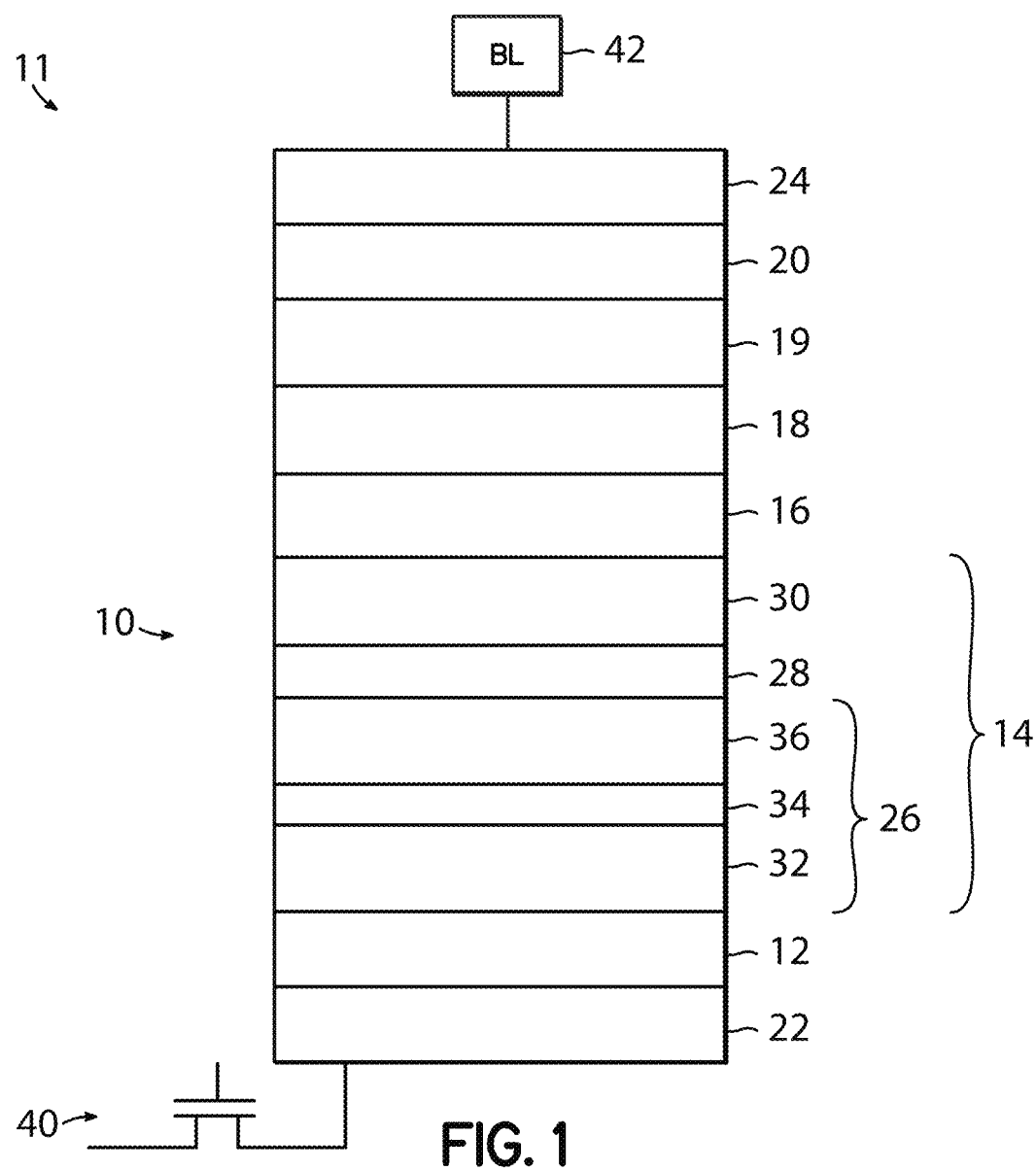
FIG. 1 is a cross-sectional view of a magnetoresistive memory element in accordance with embodiments of the invention.

With reference to FIG. 1 and in accordance with embodiments of the invention, a perpendicular magnetic-tunneling-junction (MTJ) layer stack 10 of a magnetoresistive memory (MRAM) element 11 generally includes a seed layer 12, a fixed layer 14, a tunneling barrier layer 16, a free layer 18, a tunneling barrier layer 19, and a cap layer 20. The seed layer 12 is disposed on a bottom or lower electrode 22 of the magnetoresistive memory element 11, and a top or upper electrode 24 of the magnetoresistive memory element 11 is disposed on the cap layer 20. The layer stack 10 is arranged in a vertical direction between the lower and upper electrodes 22, 24. The layers 14, 16, 18, 19, 20 of the layer stack 10 may be sequentially formed on the seed layer 12 by one or more deposition processes.

The seed layer 12 may enable a smooth and densely-packed deposition and growth of the subsequently-formed layers 14, 16, 18, 19, 20 of the layer stack 10. To that end, the seed layer 12 may contain nickel, chromium, and an additional element, such as ruthenium, that improves surface smoothness when added to an alloy containing nickel and chromium. In an embodiment, the seed layer 12 may be composed of an alloy of nickel (Ni), chromium (Cr), and ruthenium (Ru), also referred to herein as a nickel-chromium-ruthenium (NiCrRu) alloy. In an embodiment, the seed layer 12 may be composed of a nickel-chromium-ruthenium alloy that, aside from trace elements, only contains nickel, chromium, and ruthenium. Due to the addition of ruthenium, the seed layer 12 may exhibit a reduced surface roughness in comparison with nickel-chromium seed layers that lack ruthenium.

The seed layer 12 may be deposited using a co-sputtering method of physical vapor deposition that is performed in an evacuated deposition chamber using two or more targets. For example, to form a nickel-chromium-ruthenium alloy, a target containing both nickel and chromium may be used as a source material to generate sputtered atoms of nickel and chromium, and a separate target containing ruthenium may be used as a separate source material to generate sputtered atoms of ruthenium. Energetic ions are directed toward the targets with individualized applied powers that, at least in part, determine the relative sputtering rates of material from the respective targets. The specific composition ratio of nickel and chromium to ruthenium may be controlled by controlling the power applied to each target. For example, the ruthenium content of the nickel-chromium-ruthenium alloy forming the seed layer 12 may be increased by increasing the power applied to the ruthenium target and reducing the power applied to the nickel-chromium target.

In an embodiment, the composition of the nickel-chromium-ruthenium alloy forming the seed layer 12 may include ruthenium in a range of seven (7) atomic percent by weight to eighty-four (84) atomic percent by weight, balance nickel and chromium. The balance of the seed layer 12 includes nickel and chromium, and the balance of the seed layer 12 may include equal atomic percentages by weight of nickel and chromium. In an embodiment, the seed layer 12 may have a thickness within a range of about two (2) nanometers to about ten (10) nanometers. In an embodiment, the seed layer 12 may have a thickness of about six (6) nanometers. In an embodiment, the seed layer 12 is a single layer of material characterized by an alloy containing a substantially uniform composition of nickel, chromium, and ruthenium. In an embodiment, the seed layer 12 only includes nickel, chromium, and ruthenium, and does not include any other element beyond trace amounts. In an embodiment, the seed layer 12 only includes nickel, chromium, and ruthenium, and does not include any other element. In an embodiment, the seed layer 12 may include an element in addition to nickel, chromium, and ruthenium that does not materially affect the reduction in surface roughness.

In alternative embodiments, the composition of the nickel-chromium-ruthenium alloy forming the seed layer 12 may include ruthenium in a range of thirteen (13) atomic percent by weight to eighty-four (84) atomic percent by weight, ruthenium in a range of eighteen (18) atomic percent by weight to eighty-four (84) atomic percent by weight, ruthenium in a range of twenty-five (25) atomic percent by weight to eighty-four (84) atomic percent by weight, ruthenium in a range of thirty-one (31) atomic percent by weight to eighty-four (84) atomic percent by weight, ruthenium in a range of forty (40) atomic percent by weight to eighty-four (84) atomic percent by weight, ruthenium in a range of forty-eight (48) atomic percent by weight to eighty-four (84) atomic percent by weight, ruthenium in a range of sixty-four (64) atomic percent by weight to eighty-four (84) atomic percent by weight, or ruthenium in a range of seventy-eight (78) atomic percent by weight to eighty-four (84) atomic percent by weight.

In alternative embodiments, the composition of the nickel-chromium-ruthenium alloy forming the seed layer 12 may include ruthenium in a range of thirteen (13) atomic percent by weight to seventy-eight (78) atomic percent by weight, ruthenium in a range of eighteen (18) atomic percent by weight to seventy-eight (78) atomic percent by weight, ruthenium in a range of twenty-five (25) atomic percent by weight to seventy-eight (78) atomic percent by weight, ruthenium in a range of thirty-one (31) atomic percent by weight to seventy-eight (78) atomic percent by weight, ruthenium in a range of forty (40) atomic percent by weight to seventy-eight (78) atomic percent by weight, ruthenium in a range of forty-eight (48) atomic percent by weight to seventy-eight (78) atomic percent by weight, or ruthenium in a range of sixty-four (64) atomic percent by weight to seventy-eight (78) atomic percent by weight.

In alternative embodiments, the composition of the nickel-chromium-ruthenium alloy forming the seed layer 12 may include ruthenium in a range of thirteen (13) atomic percent by weight to sixty-four (64) atomic percent by weight, ruthenium in a range of eighteen (18) atomic percent by weight to sixty-four (64) atomic percent by weight, ruthenium in a range of twenty-five (25) atomic percent by weight to sixty-four (64) atomic percent by weight, ruthenium in a range of thirty-one (31) atomic percent by weight to sixty-four (64) atomic percent by weight, ruthenium in a range of forty (40) atomic percent by weight to sixty-four (64) atomic percent by weight, or ruthenium in a range of forty-eight (48) atomic percent by weight to sixty-four (64) atomic percent by weight.

In alternative embodiments, the composition of the nickel-chromium-ruthenium alloy forming the seed layer 12 may include ruthenium in a range of thirteen (13) atomic percent by weight to forty-eight (48) atomic percent by weight, ruthenium in a range of eighteen (18) atomic percent by weight to forty-eight (48) atomic percent by weight, ruthenium in a range of twenty-five (25) atomic percent by weight to forty-eight (48) atomic percent by weight, ruthenium in a range of thirty-one (31) atomic percent by weight to forty-eight (48) atomic percent by weight, or ruthenium in a range of forty (40) atomic percent by weight to forty-eight (48) atomic percent by weight.

In alternative embodiments, the composition of the nickel-chromium-ruthenium alloy forming the seed layer 12 may include ruthenium in a range of thirteen (13) atomic percent by weight to forty (40) atomic percent by weight, ruthenium in a range of eighteen (18) atomic percent by weight to forty (40) atomic percent by weight, ruthenium in a range of twenty-five (25) atomic percent by weight to forty (40) atomic percent by weight, or ruthenium in a range of thirty-one (31) atomic percent by weight to forty (40) atomic percent by weight.

In alternative embodiments, the composition of the nickel-chromium-ruthenium alloy forming the seed layer 12 may include ruthenium in a range of thirteen (13) atomic percent by weight to thirty-one (31) atomic percent by weight, ruthenium in a range of eighteen (18) atomic percent by weight to thirty-one (31) atomic percent by weight, or ruthenium in a range of twenty-five (25) atomic percent by weight to thirty-one (31) atomic percent by weight.

In alternative embodiments, the composition of the nickel-chromium-ruthenium alloy forming the seed layer 12 may include ruthenium in a range of thirteen (13) atomic percent by weight to twenty-five (25) atomic percent by weight, or ruthenium in a range of eighteen (18) atomic percent by weight to twenty-five (25) atomic percent by weight.

In an alternative embodiment, the composition of the nickel-chromium-ruthenium alloy forming the seed layer 12 may include ruthenium in a range of thirteen (13) atomic percent by weight to eighteen (18) atomic percent by weight.

The seed layer 12 governs the deposition and growth of the fixed layer 14, tunneling barrier layer 16, free layer 18, tunneling barrier layer 19, and cap layer 20. Specifically, the surface roughness of the seed layer 12 is propagated upward through the layer stack 10 to the overlying layers 14, 16, 18, 19, and 20. A reduction in the surface roughness of the seed layer 12 reduces the surface roughness of the layers 14, 16, 18, 19, and 20 and, in particular, reduces the surface roughness of the tunneling barrier layers 16, 19. The reduction in surface roughness may improve the tunneling magnetoresistance (TMR) of the perpendicular magnetic-tunneling-junction layer stack 10. The improvement in the tunneling magnetoresistance of the perpendicular magnetic-tunneling-junction layer stack 10 may be achieved without increasing the tunneling resistance.

The fixed layer 14 may be disposed directly on the seed layer 12. The fixed layer 14 may include a synthetic antiferromagnetic layer 26, a reference layer 30, and a transition layer 28 arranged in a vertical direction between the synthetic antiferromagnetic layer 26 and the reference layer 30. The synthetic antiferromagnetic layer 26 is directly deposited on the seed layer 12, and then the transition layer 28 and reference layer 30 are sequentially deposited on the synthetic antiferromagnetic layer 26.

The synthetic antiferromagnetic layer 26 may include a magnetic layer 32 that is disposed on the seed layer 12, a magnetic layer 36, and a spacer layer 34 that separates the magnetic layer 32 from the magnetic layer 36. The magnetic layers 32, 36 may be polarized to have opposite directions of magnetization, and the spacer layer 34 may function to promote pinning of the magnetization of the magnetic layers 32, 36. The magnetic layers 32, 36 may be composed of a magnetic material, such as a cobalt/palladium alloy or multilayer, an iron/palladium alloy or multilayer, a cobalt/platinum alloy or multilayer, an iron/platinum alloy or multilayer, or a cobalt/nickel alloy or multilayer. The spacer layer 34 may be composed of a non-magnetic material, such as ruthenium or molybdenum. The layers 32, 34, 36 of the fixed layer 14 may be formed epitaxially on the seed layer 12 with a given crystalline orientation, such as a (111) orientation of a face-centered-cubic (fcc) crystal structure.

The transition layer 28 of the fixed layer 14 may be composed of a non-magnetic material, such as tantalum, deposited by physical vapor deposition with sputtering. The transition layer 28 interrupts the crystal structure of the underlying layers 32, 36, 34. Specifically, the transition layer 28 may be deposited in an amorphous condition that lacks an organized crystal structure, such as a crystal structure having long range order.

The reference layer 30 of the fixed layer 14 is disposed on the transition layer 28. The reference layer 30 may be highly disordered due to its deposition on the transition layer 28. In an embodiment, the reference layer 30 may be an amorphous layer. In an embodiment, the reference layer 30 may be composed of a magnetic material, such as a cobalt-iron-boron alloy.

The tunneling barrier layer 16 is disposed on the reference layer 30 of the fixed layer 14. The tunneling barrier layer 16 may be composed of a non-magnetic and electrically-insulating dielectric material. For example, the tunneling barrier layer 16 may be composed of magnesium oxide or aluminum oxide.

The free layer 18, which has a magnetic orientation that may be switched relative to the fixed magnetic orientation of the reference layer 30 during operation of the magnetoresistive memory element 11, is disposed on the tunneling barrier layer 16. In an embodiment, the free layer 18 may be an amorphous layer. In an embodiment, the free layer 18 may be composed of a magnetic material, such as a cobalt-iron-boron alloy. The tunneling barrier layer 16 is disposed between the fixed layer 14 and the free layer 18.

The tunneling barrier layer 19 is disposed on the free layer 18. The tunneling barrier layer 19 may be composed of a non-magnetic and electrically-insulating dielectric material. For example, the tunneling barrier layer 16 may be composed of magnesium oxide or aluminum oxide.

The cap layer 20 is disposed on the tunneling barrier layer 19 and is arranged in a vertical direction between the tunneling barrier layer 19 and the upper electrode 24. The cap layer 20 may be composed of ruthenium, tantalum, tungsten, molybdenum, or another suitable metal.

The magnetoresistive memory element 11 including the layer stack 10 is configured to store data in a non-volatile manner. Data is stored in the layer stack 10 of the magnetoresistive memory element 11 through different states provided by the relative magnetization orientations of the fixed layer 14 and the free layer 18. The magnetization of the fixed layer 14 has a pinned magnetic orientation that is constant, and the magnetization of the free layer 18 can be changed by the application of a directional programming current flowing through the layer stack 10 between the electrodes 20, 22. In particular, a programming current can cause the magnetic orientations of the fixed layer 14 and free layer 18 to be parallel, giving a lower electrical resistance across the layers ("0" state), or the programming current can cause the magnetic orientations of the fixed layer 14 and free layer 18 to be antiparallel, giving a higher electrical resistance across the layers ("1" state). The switching of the magnetic orientation of the free layer 18 and the resulting high or low resistance states across the fixed layer 14 and free layer 18 in the layer stack 10 provide for the write and read operations of the magnetoresistive memory element 11.

The layer stack 10 may be patterned with lithography and etching processes to impart a given shape to the magnetoresistive memory element 11. The magnetoresistive memory element 11 may be disposed in a metallization level of an interconnect structure fabricated by back-end-of-line processes. The magnetoresistive memory element 11 may be part of a bitcell that further includes a field-effect transistor 40 that is connected through the back-end-of-line interconnect structure with the magnetoresistive memory element 11. The field-effect transistor 40 may be fabricated by front-end-of-line processing on a semiconductor substrate, and a drain of the field-effect transistor 40 may be connected through the interconnect structure with the lower electrode 22 of the magnetoresistive memory element 11. The upper electrode 24 of the magnetoresistive memory element 11 may be connected with a bit line 42 of the interconnect structure.

Principles of the inventive embodiments may be illustrated by the following examples.

With reference to FIGS. 2-5, magnetoresistive memory elements including magnetic-tunneling-junction layer stacks were formed on NiCrRu seed layers of various different compositions, as generally described in connection with FIG. 1. For comparison, a magnetoresistive memory element including a magnetic-tunneling-junction layer stack was also formed on a NiCr layer. The NiCrRu seed layers of each layer stack included ruthenium in an amount ranging from seven (7) atomic percent by weight (NiCrRu7) to ninety-two (92) atomic percent by weight (NiCrRu92). The tunneling barrier layers in each layer stack were composed of magnesium oxide, and the free layer and the reference layer of the fixed layer were composed of a cobalt-iron-boron alloy.

Each of the magnetic-tunneling-junction layer stacks was electrically tested to determine the tunneling magnetoresistance (TMR) and the tunneling resistance as measured by the resistance-area (RA) product. To that end, the electrical resistance of each layer stack was measured over a range of currents. Each of the layer stacks has an electrical resistance when the free and reference layers are aligned in the parallel state, and a different electrical resistance when the free and reference layers are aligned in the anti-parallel state. The tunneling magnetoresistance (TMR) may be calculated as the difference between the electrical resistances in the parallel and anti-parallel states divided by the electrical resistance in the parallel state. The RA product representing the tunneling resistance may be calculated as the resistance in the parallel state divided by the area of the interface between the fixed layer or free layer and the tunneling barrier layer of each layer stack.

Figure 4:
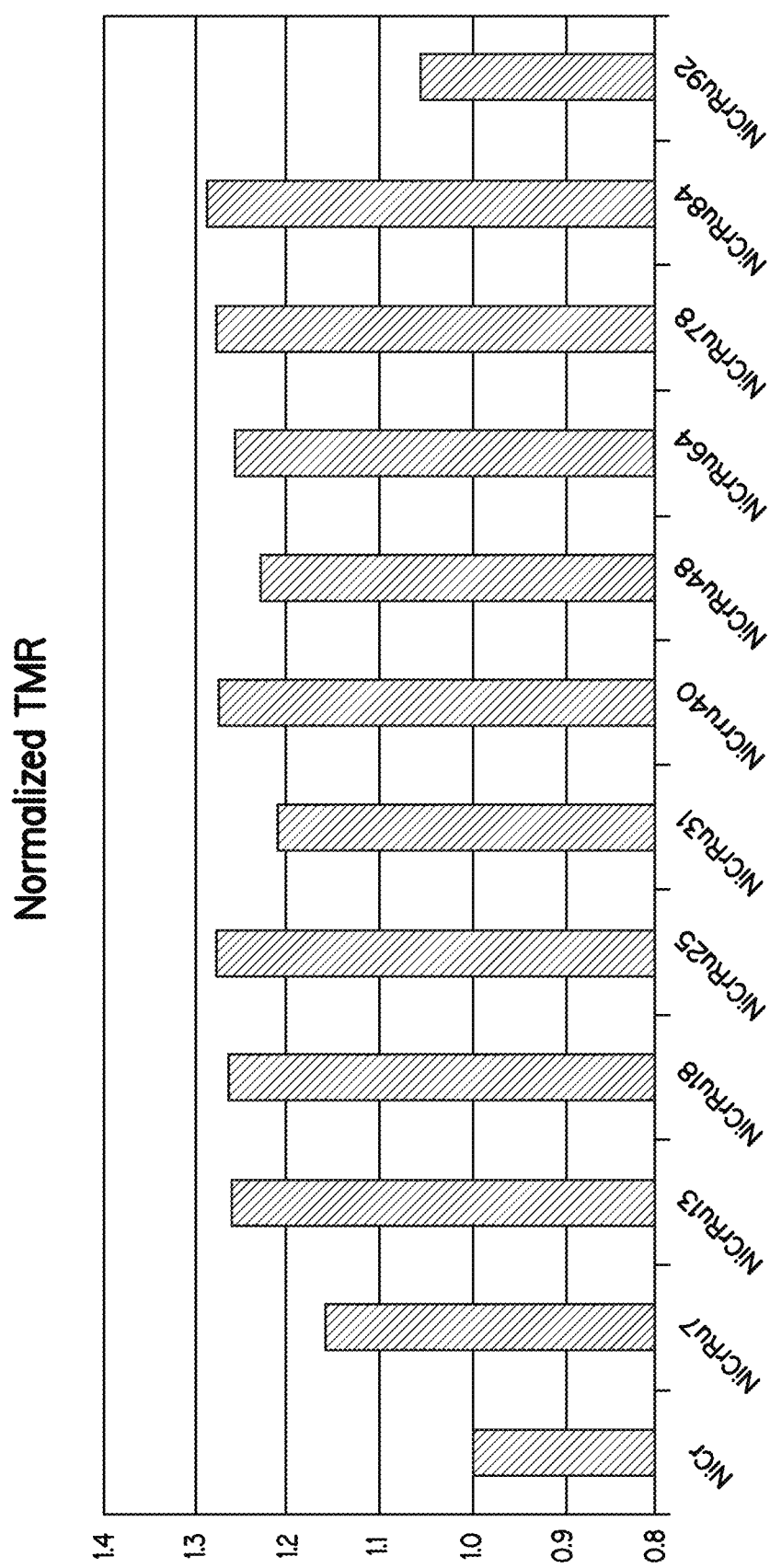
FIG. 4 is a bar graph showing the tunneling magnetoresistance (TMR) for magnetic-tunneling-junction layer stacks formed with NiCrRu seed layers having different ruthenium contents, and a magnetic-tunneling-junction layer stack formed on a prior art NiCr seed layer.
Figure 5:
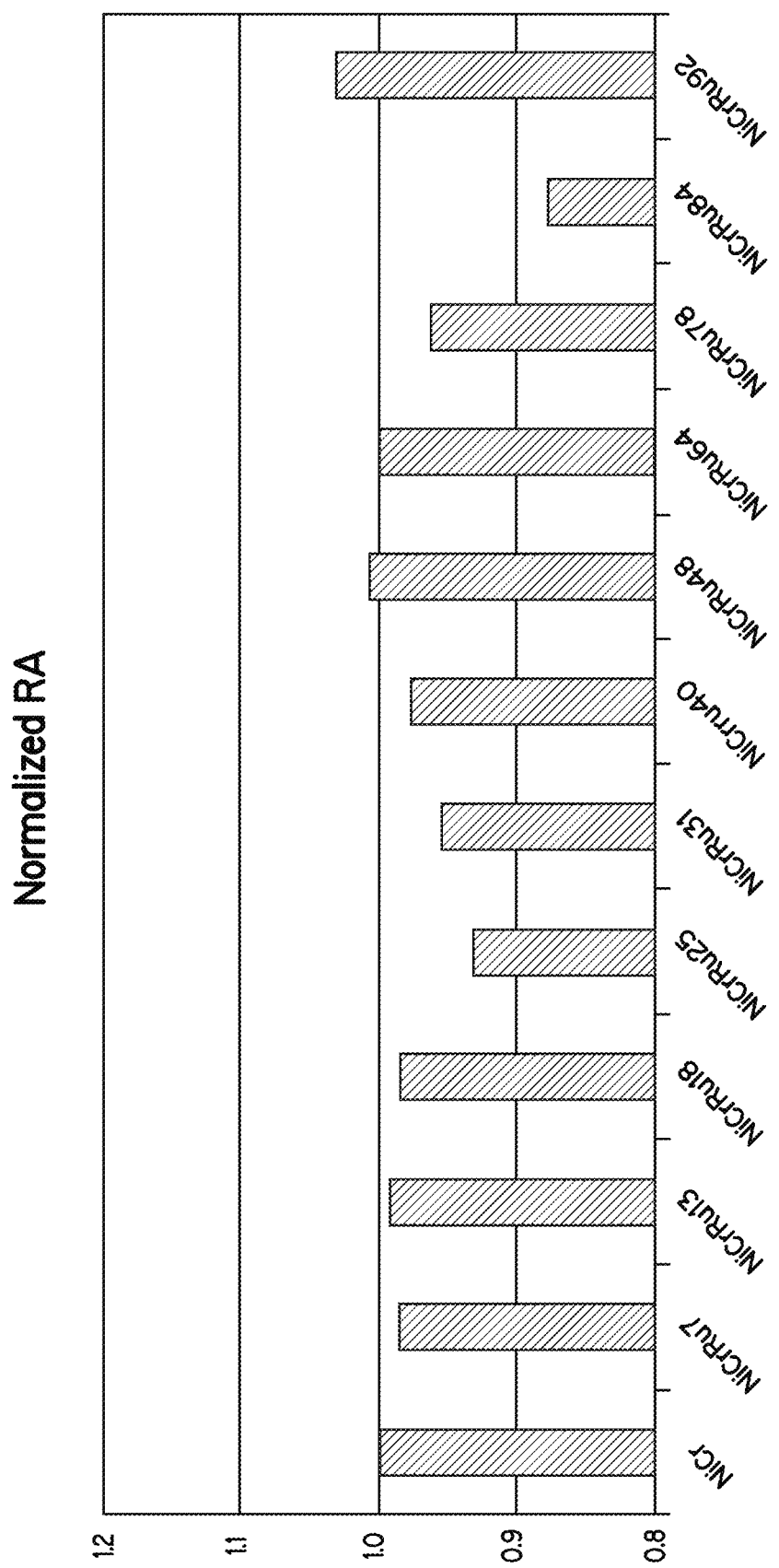
FIG. 5 is a bar graph showing the resistance-area (RA) product for magnetic-tunneling-junction layer stacks formed with NiCrRu seed layers having different ruthenium contents, and a magnetic-tunneling-junction layer stack formed on a prior art NiCr seed layer.

Normalized values of TMR for the different layer stacks are plotted in FIG. 4, and normalized values of RA for the different layer stacks are plotted in FIG. 5. As shown in FIG. 4, the layer stacks formed using NiCrRu seed layers containing ruthenium in an amount ranging from seven (7) atomic percent by weight to eighty-four (84) atomic percent by weight exhibited a tunneling magnetoresistance that was greater than the tunneling magnetoresistance of the layer stack formed using the NiCr seed layer. The improvement in the tunneling magnetoresistance over this range of ruthenium-containing compositions was achieved without increasing the tunneling resistance, as apparent in FIG. 5.

Figure 2:
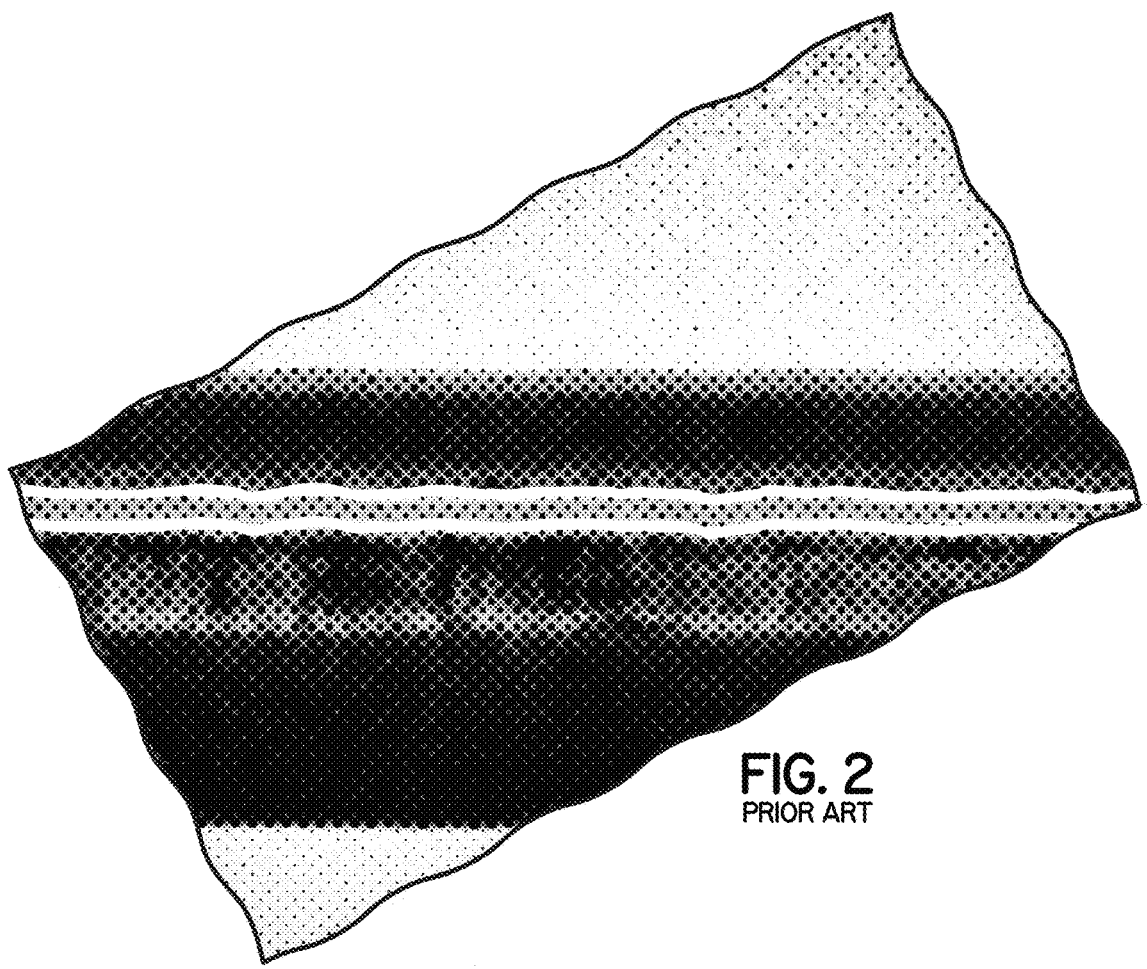
FIG. 2 is an image illustrating a magnetoresistive memory element including a magnetic-tunneling-junction layer stack formed with a NiCr seed layer in accordance with the prior art.
Figure 3:
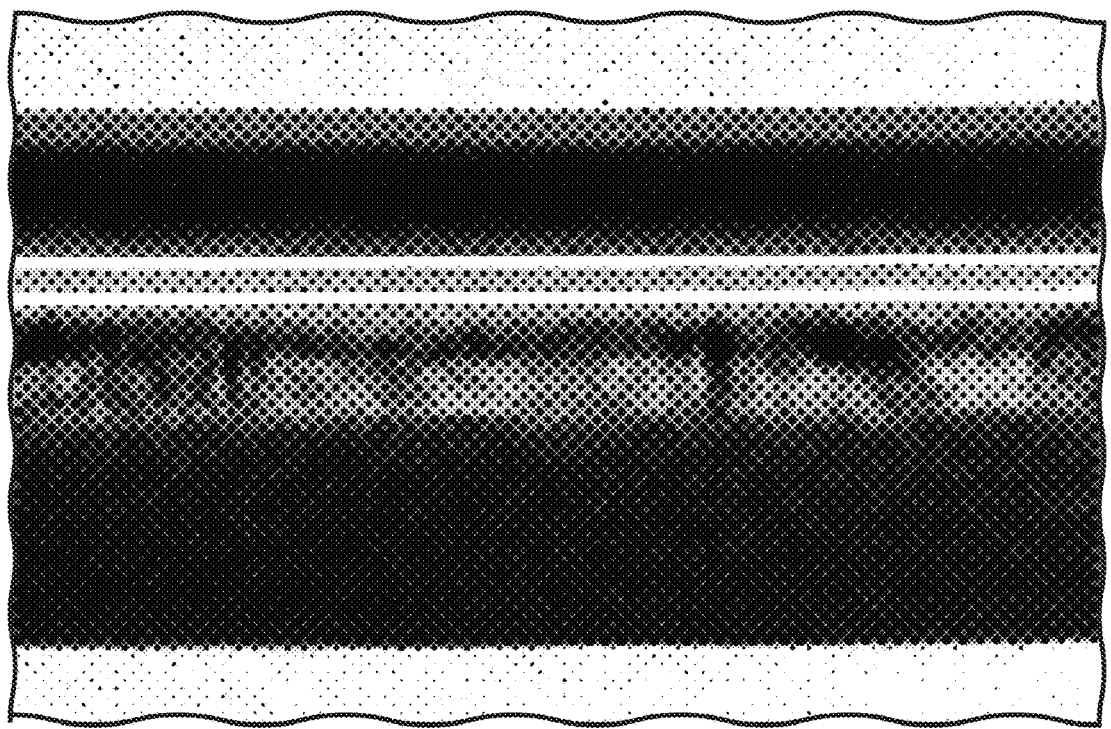
FIG. 3 is an image illustrating a magnetoresistive memory element including a magnetic-tunneling-junction layer stack formed with a NiCrRu seed layer in accordance with embodiments of the invention.

In addition to the improvement in the tunneling magnetoresistance, the layer stacks formed with NiCrRu seed layers also exhibited an improved surface smoothness (i.e., a reduced surface roughness). In particular, the tunnel barrier layers having interfaces with the fixed and free layers exhibited an improvement in surface smoothness, which implies an improvement in the surface roughness of all layers formed on the NiCrRu seek layers. To illustrate this improvement, the layer stack formed using a NiCrRu seed layer containing 84 atomic percent ruthenium and balance nickel and chromium, as well as the layer stack formed using a NiCr seed layer, were imaged with transmission electron microscopy. The transmission electron micrograph for the layer stack formed on the NiCr layer is shown in FIG. 2, and the transmission electron micrograph for the layer stack formed on the (NiCr)Ru84 layer is shown in FIG. 3. The tunneling barrier layer between the fixed layer and free layer and the tunneling barrier layer between the free layer and the cap layer are visible in the electron micrograph as the bright horizontal lines in FIGS. 2 and 3. As apparent from a comparison of FIG. 2 with FIG. 3, the layers of the layer stack, and the tunneling barrier layers in particular, formed using the (NiCr)Ru84 seed layer exhibit a reduced surface roughness at the interfaces with the adjoining fixed and free layers in comparison with the layers of the layer stack formed using the NiCr see layer. Qualitatively, the different is surface roughness is readily apparent because the tunnel barrier layers in FIG. 3 are noticeably smoother (i.e., have a reduced amplitude of waviness in a vertical direction) than the tunneling barrier layers in FIG. 2.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a non-volatile memory element, the structure comprising:
   a bottom electrode;
   a seed layer on the bottom electrode; and
   a magnetic-tunneling-junction layer stack on the seed layer,
   wherein the seed layer is comprised of a nickel-chromium-ruthenium alloy including ruthenium in an amount ranging from seven atomic percent by weight to eighty-four atomic percent by weight.

2. The structure of claim 1 wherein the seed layer has a thickness ranging from about two nanometers to about ten nanometers.

3. The structure of claim 1 wherein the seed layer is a single layer of material with a substantially uniform composition of nickel, chromium, and ruthenium.

4. The structure of claim 1 wherein the seed layer is a single layer of material.

5. The structure of claim 1 wherein the seed layer has a substantially uniform composition of nickel, chromium, and ruthenium.

6. The structure of claim 1 further comprising:
a field-effect transistor having a drain connected with the bottom electrode.

7. The structure of claim 6 further comprising:
a metallization level over the field-effect transistor,
wherein the seed layer, the bottom electrode, and the magnetic-tunneling-junction layer stack are arranged in the metallization level.

8. The structure of claim 1 wherein the magnetic-tunneling-junction layer stack further includes a fixed layer, a free layer, and a tunneling barrier layer arranged in a vertical direction between the fixed layer and the free layer.

9. The structure of claim 1 wherein the seed layer only includes trace elements in addition to nickel, chromium, and ruthenium.

10. The structure of claim 1 wherein the seed layer consists of nickel, chromium, and ruthenium.

11. The structure of claim 1 wherein the seed layer consists essentially of nickel, chromium, and ruthenium.

12. The structure of claim 1 wherein the magnetic-tunneling-junction layer stack is arranged directly on the seed layer.

13. The structure of claim 1 wherein the nickel-chromium-ruthenium alloy includes ruthenium in an amount ranging from forty atomic percent by weight to seventy-eight atomic percent by weight.

14. A method of forming a non-volatile memory element, the method comprising:
forming a bottom electrode;
depositing a seed layer on the bottom electrode; and
forming a magnetic-tunneling-junction layer stack on the seed layer,
wherein the seed layer is comprised of a nickel-chromium-ruthenium alloy including ruthenium in an amount ranging from seven atomic percent by weight to eighty-four atomic percent by weight.

15. The method of claim 14 wherein the seed layer is deposited as a single layer of material with a substantially uniform composition of nickel, chromium, and ruthenium.

16. The method of claim 14 further comprising:
forming a field-effect transistor having a drain connected with the bottom electrode.

17. The method of claim 16 further comprising:
forming a metallization level over the field-effect transistor,
wherein the seed layer, the bottom electrode, and the magnetic-tunneling-junction layer stack are arranged in the metallization level.

18. The method of claim 14 wherein the magnetic-tunneling-junction layer stack further includes a fixed layer, a free layer, and a tunneling barrier layer arranged in a vertical direction between the fixed layer and the free layer.

19. The method of claim 14 wherein the magnetic-tunneling-junction layer stack is arranged directly on the seed layer.

20. The method of claim 14 wherein the nickel-chromium-ruthenium alloy includes ruthenium in an amount ranging from forty atomic percent by weight to seventy-eight atomic percent by weight.

* * * * *